United States Patent
Konieczny et al.

(10) Patent No.: US 7,869,886 B2
(45) Date of Patent: Jan. 11, 2011

(54) CONTROL BLOCK WITH A POINT-TO-POINT COMMUNICATION LINK BETWEEN A CONTROL MASTER MODULE TO BE CONNECTED TO A DATA BUS AND EXPANSION SLAVE MODULES

(75) Inventors: Frank Konieczny, Lemgo (DE);
Dietmar Krumsiek, Emmerthal (DE)

(73) Assignee: Phoenix Contact GmbH & Co. KG (DE)

(*) Notice: Subject to any disclaimer, the term of this patent is extended or adjusted under 35 U.S.C. 154(b) by 231 days.

(21) Appl. No.: 12/204,430

(22) Filed: Sep. 4, 2008

(65) Prior Publication Data
US 2009/0083446 A1 Mar. 26, 2009

(30) Foreign Application Priority Data
Sep. 26, 2007 (DE) .................. 10 2007 046 178

(51) Int. Cl.
*G05B 19/18* (2006.01)
*G06F 3/00* (2006.01)

(52) U.S. Cl. .............. 700/3; 700/1; 700/2; 700/18; 700/19; 700/20; 700/22; 710/2; 710/3; 710/8; 710/9; 710/10; 710/11; 710/62; 710/72

(58) Field of Classification Search ............ 710/2
See application file for complete search history.

(56) References Cited

U.S. PATENT DOCUMENTS

| | | | | |
|---|---|---|---|---|
| 4,459,655 A | * | 7/1984 | Willemin ............. | 700/3 |
| 4,658,375 A | * | 4/1987 | Onogi et al. .......... | 710/2 |
| 5,528,215 A | * | 6/1996 | Siu et al. ............. | 340/286.01 |
| 6,147,877 A | * | 11/2000 | Strandberg et al. .... | 361/784 |
| 6,721,810 B2 | * | 4/2004 | Massie ................ | 710/3 |
| 6,738,830 B2 | * | 5/2004 | Massie ................ | 710/2 |

(Continued)

FOREIGN PATENT DOCUMENTS

DE 19616551 A1 * 10/1997

(Continued)

OTHER PUBLICATIONS

'IO-Link Specification in Brief' by IO-Link, version 1.0, Nov. 24, 2008.*

Primary Examiner—Henry W Tsai
Assistant Examiner—Steven G Snyder
(74) Attorney, Agent, or Firm—DeMont & Breyer, LLC (57) ABSTRACT

The invention relates to an input/output channel control block that comprises a number of successive input/output modules. The first is a control master module and the subsequent ones are expansion slave modules. Each expansion slave module comprises a processing logic unit as well as respective first signal port and a respective equal number of second signal ports and an equal number of third signal ports which are arranged at identical positions of each expansion slave module. The first signal port is connected to the processing logic unit, to which at least one fourth signal port for connecting an input/output bus terminal subscriber belongs, and a respective second signal port is connected to a third signal port. The control master module likewise possesses a number of third signal ports and a control logic unit for data exchange with a data bus and for targeted driving of the signal ports.

35 Claims, 4 Drawing Sheets

U.S. PATENT DOCUMENTS

| | | | |
|---|---|---|---|
| 6,970,950 B2 * | 11/2005 | Aumer et al. | 710/9 |
| 7,246,184 B2 * | 7/2007 | Griessbaum | 710/110 |
| 7,484,019 B2 * | 1/2009 | Tu | 710/62 |
| 2004/0158653 A1 * | 8/2004 | Aumer et al. | 710/8 |
| 2005/0021712 A1 * | 1/2005 | Chassapis et al. | 709/223 |
| 2005/0114577 A1 * | 5/2005 | Beckhoff et al. | 710/110 |
| 2005/0132113 A1 * | 6/2005 | Griessbaum | 710/110 |
| 2005/0154809 A1 * | 7/2005 | Becker et al. | 710/104 |
| 2006/0069452 A1 * | 3/2006 | Pfister et al. | 700/18 |
| 2006/0213952 A1 * | 9/2006 | Johansen | 228/1.1 |
| 2008/0052435 A1 * | 2/2008 | Norwood et al. | 710/301 |
| 2008/0231437 A1 * | 9/2008 | Singhal et al. | 340/514 |
| 2008/0244104 A1 * | 10/2008 | Clemente | 710/11 |
| 2009/0083464 A1 * | 3/2009 | Beckhoff et al. | 710/110 |
| 2009/0117934 A1 * | 5/2009 | Biehler | 455/525 |
| 2009/0265020 A1 * | 10/2009 | Blair et al. | 700/19 |

FOREIGN PATENT DOCUMENTS

EP    1524890 A1 *   4/2005

* cited by examiner

CONTROL BLOCK WITH A POINT-TO-POINT COMMUNICATION LINK BETWEEN A CONTROL MASTER MODULE TO BE CONNECTED TO A DATA BUS AND EXPANSION SLAVE MODULES

FIELD OF THE INVENTION

The invention pertains to an input/output channel control block that comprises a number of successive input/output modules, wherein the first is an input/output control master module and the subsequent ones are input/output expansion slave modules, as well as a corresponding control master module.

BACKGROUND OF THE INVENTION

Time relays, counters or relays frequently meet the requirements for a universal control device only to a limited extent, particularly in the field of automation technology for the automation of complex logical linkages, error processes or timing. Complex SPS (stored program control) systems are often over-dimensioned with regard to their technical equipment features and are consequently too expensive in production.

In order to close this gap, compact control modules are known which offer the user the advantage that he can realize a great number of applications from the lower performance range with only one automation component. Depending on the model and the expansion, between 4 and 48 inputs or outputs, referred to below as I/O, can be handled with compact control modules of this type available in the market. A signal arriving from a bus terminal subscriber such as a sensor via an input is processed by the control module and/or conducted to a data bus, and a signal arriving from the data bus or a processed signal arriving via an input is conducted via an output to a bus terminal subscriber, such as an actuator.

Such a compact I/O control module thus generally links signals arriving via input modules according to a defined control logic and then outputs signals via the output modules.

The number and types of I/O channels of today's compact I/O modules are fixed, however, and comprise, for example, 2 inputs and 2 outputs, wherein, for instance, 1 input is provided for digital signals and 1 input for analog signals.

The linking of the input signals and the generation of the output signals by the compact control module is thus performed for the fixed number of I/O channels. Fixed physical interfaces for connection can be assigned to the I/O channels, so that the input/output modules are plugged into corresponding sockets, for example. Alternatively, logical interfaces can also be assigned to the I/O channels at the control module, so that the linkage of each input/output channel to the control module takes place via a common physical interface, using a data bus.

A substantial disadvantage of prior art is fundamentally that there are always only a fixed number of inputs and outputs for such control modules. Every expansion of I/O channels is cost-intensive and can only be done as a rule with additional use of the data bus or an additional data bus.

If a data bus is used, it is at least necessary also to address the input/output modules.

SUMMARY OF THE INVENTION

One problem of the invention is thus to demonstrate a way with which the number of usable terminals of a compact I/O module constituting the present class as described above can be expanded.

The invention thus proposes a compact input/output module channel control block that comprises a number of successive input/output modules, wherein the first is an input/output control module or master module and the subsequent ones are input/output expansion modules or slave modules. Every expansion slave module proposed according to the invention comprises a processing logic unit as well as a respective first signal port and a respective equal number of second signal ports and a respective equal number of third signal ports, which are expediently arranged at identical positions of each expansion slave module, wherein the first signal port is connected to the processing logic unit, to which at least one fourth input/output bus terminal subscriber belongs, and a respective second signal port is connected to third signal port. A control master module proposed according to the invention likewise has a number of third signal ports and a control logic unit for data exchange with a data bus and for targeted driving of this signal port. The control master module and the expansion slave modules are connected to one another such that in each case the same port of the number of third signal ports of a preceding module is connected to the first signal port of a subsequent module, and every additional signal port of the number of third signal ports is connected in each case to a signal port of the number of second signal ports of the subsequent module.

Due to the thereby guaranteed modular provision of required application-specific expansion slave modules, the number of terminals controlled by a compact I/O control master module can be expanded easily and individually and substantially meets the requirements in the industrial field for efficient, space-saving and nonetheless economical solutions. It is also possible to forgo specific addressing of the respective expansion slave modules, since all expansion slave modules are identically constructed and the respective addressing is accordingly defined by the concatenation of the individual expansion slave modules.

The input/output channels of the first, second and third signal ports can thus expediently be adapted to signal transmission by means of point-to-point communication.

Consequently, already known systems for point-to-point communication such as the communication system known as IO Link for connecting sensors and actuators can be used.

The invention accordingly expediently further provides a control logic unit that has a device for processing signals for point-to-point communication and for bus communication.

In a practical embodiment, the processing logic unit has a device for processing signals for point-to-point communication, wherein the processing logic unit is moreover preferably adapted for processing digital or analog standard input/output channel signals.

In particularly preferred embodiments, the fourth ports thus provide, in particular, digital or analog standard input/output channel signals and can additionally or alternatively comprise, however, point-to-point communication ports as well.

If the number of third signal ports is arranged in common on the first housing side and if, to the extent present, the first and second signal ports are arranged on a second housing side opposite the first one, each point-to-point communication connection to the respective other housing side can be aligned in that way, and the modules can therefore be concatenated adjacently in the simplest manner in that each port is automatically coupled to the respective directly subsequent port. Thus it is expediently provided that the first, second and third signal ports are connected to or integrated into respective plug-in or clamping components.

Another advantage is that the signal ports need not be constructed exclusively for hardwired signal transmission, but can alternatively also be constructed for non-hardwired signal transmission, e.g., by means of appropriate WLAN or Bluetooth transceiver devices.

Particularly preferred embodiments thus have expansion slave modules that integrate a first series of a number of point-to-point communication ports and a second series of a number of point-to-point communication ports, wherein the first port in the first series of ports is connected via a point-to-point communication link to a processing unit coupled to at least one terminal port, and wherein each of the subsequent ports of the first series of ports is connected in order via a point-to-point communication link to the ports of the second series of ports beginning with the first port in the second series.

In order also to use the invention in fields in which safety-critical data must be transmitted, e.g., in order to initiate safety-relevant measures, it is of additional advantage that the point-to-point communication is based on a safety-oriented protocol suitable for use of safety sensors and actuators.

Moreover, it is provided in particularly practical embodiments that the expansion slave modules are arranged between the control master module and a voltage supply unit, and each module has voltage distribution units aligned with one another, so that all modules are operated by means of the voltage fed in via the voltage supply unit.

BRIEF DESCRIPTION OF THE DRAWINGS

The invention will be described below in detail on the basis of several embodiments with reference to the appended drawings. The drawings show FIG. 1 a schematic sketch of a control block according to the invention with a generic control master module that integrates a number of point-to-point communication ports and four additional expansion slave modules that can be coupled to the control master module, FIG. 2 a schematic sketch of a preferred refinement of the control block, wherein the point-to-point communication ports of the respective module are arranged on housing sides facing adjacent modules, FIG. 3 a schematic sketch of an embodiment in which the expansion slave modules have digital and/or analog standard input/output channels, FIG. 4 a schematic sketch for illustrating a process diagram of an embodiment in which the expansion slave module has at least one additional point-to-point communication port, and FIGS. 5*a-c* schematic sketches of various expansion options usable according to the invention.

DETAILED DESCRIPTION

For more detailed description of the invention, the reader is referred to the appended figures. Insofar as not explicitly stated, it is to be assumed that individual characteristics can also be combined with one another in various ways within the scope of the invention.

With regard to the schematically illustrated point-to-point communication ports in the figures, it is assumed in the description below for the sake of simplicity that they are adapted for a point-to-point communication link known as "IO Link," wherein the I/O link is based on point-to-point data transmission by means of three-wire terminal connections. It is evident to a person skilled in the art, however, that point-to-point communication ports need not necessarily be constructed for hardwired signal transmission but can also be constructed for non-hardwired signal transmission by means of, for example, appropriate WLAN or Bluetooth transceiver units.

Figure 1:
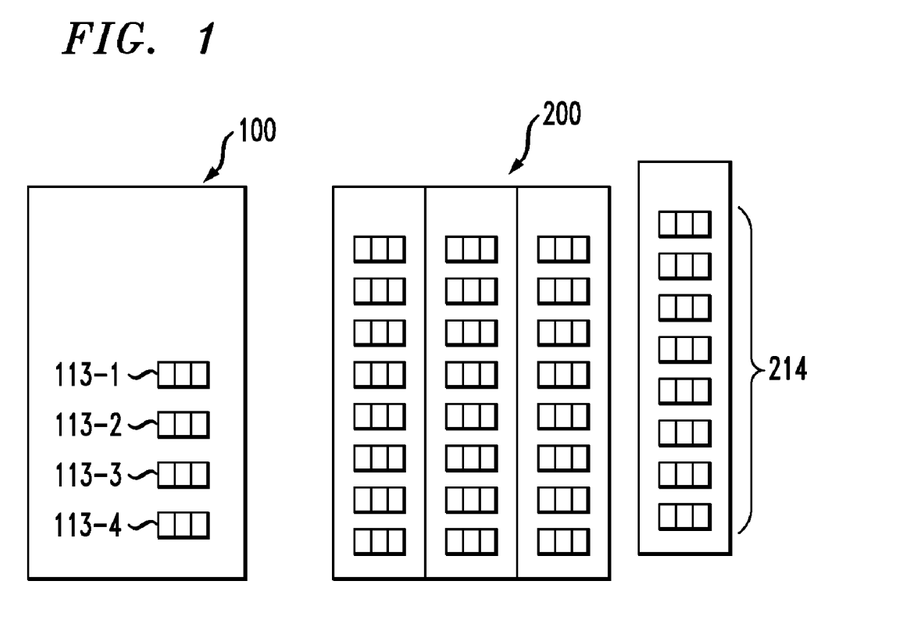
Figure 2:
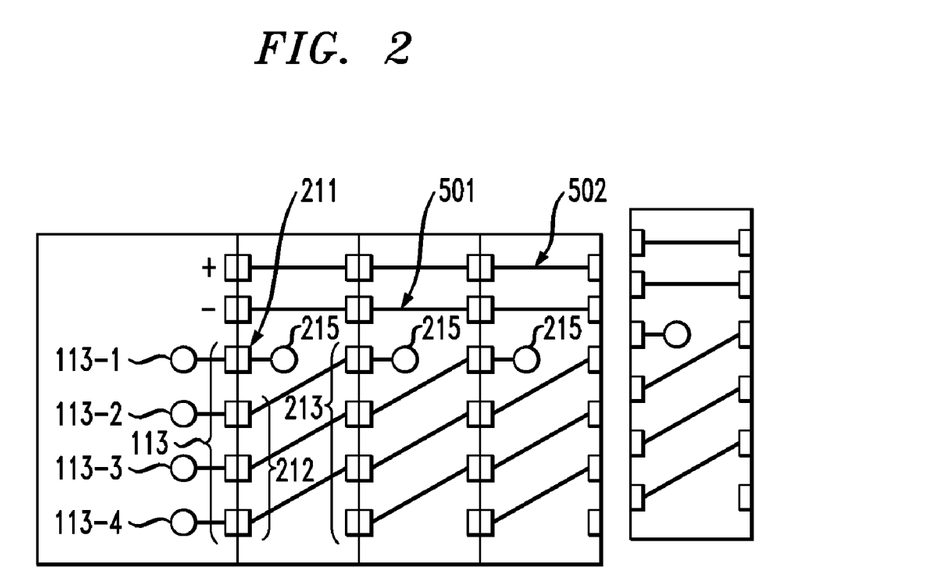
Figure 3:
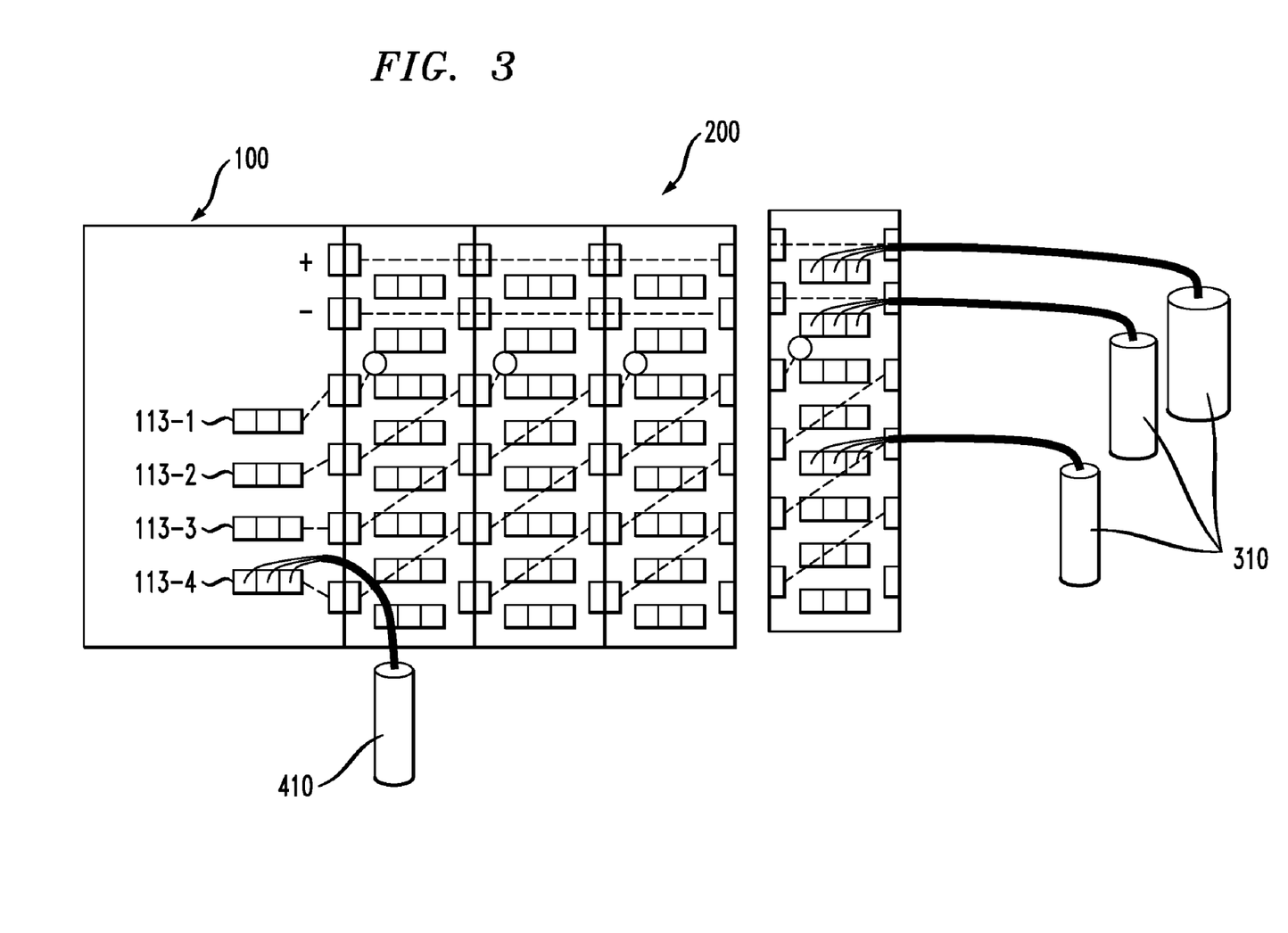

Various aspects of exemplary preferred compact input/output channel control blocks according to the invention are schematically illustrated in FIGS. 1-3. The control blocks each comprise an input/output control master module 100 as well as four electrically downstream input/output expansion slave modules 200. Each of these slave modules 200 comprises a respective first signal port 211 and a respective identical number of second signal ports 212 and an identical number of third signal ports 213. In the figures, each slave module 200 comprises three second signal ports 212 and four third signal ports 213. These are expediently always arranged at identical positions of each expansion slave module, as will become evident below. The first signal port 211 of each expansion slave module is connected to a processing logic unit 215 of the same expansion slave module 200, wherein a number of fourth signal ports 214 belonging to processing logic unit 215 that are connected to processing logic unit 215 at terminals, not shown in the figures, for connecting input/output bus terminal subscribers such as sensors and actuators 310. Additionally, a respective second signal port 212 of each expansion slave module 200 is connected to a third signal port 213 of the same expansion slave module 200.

Figure 4:
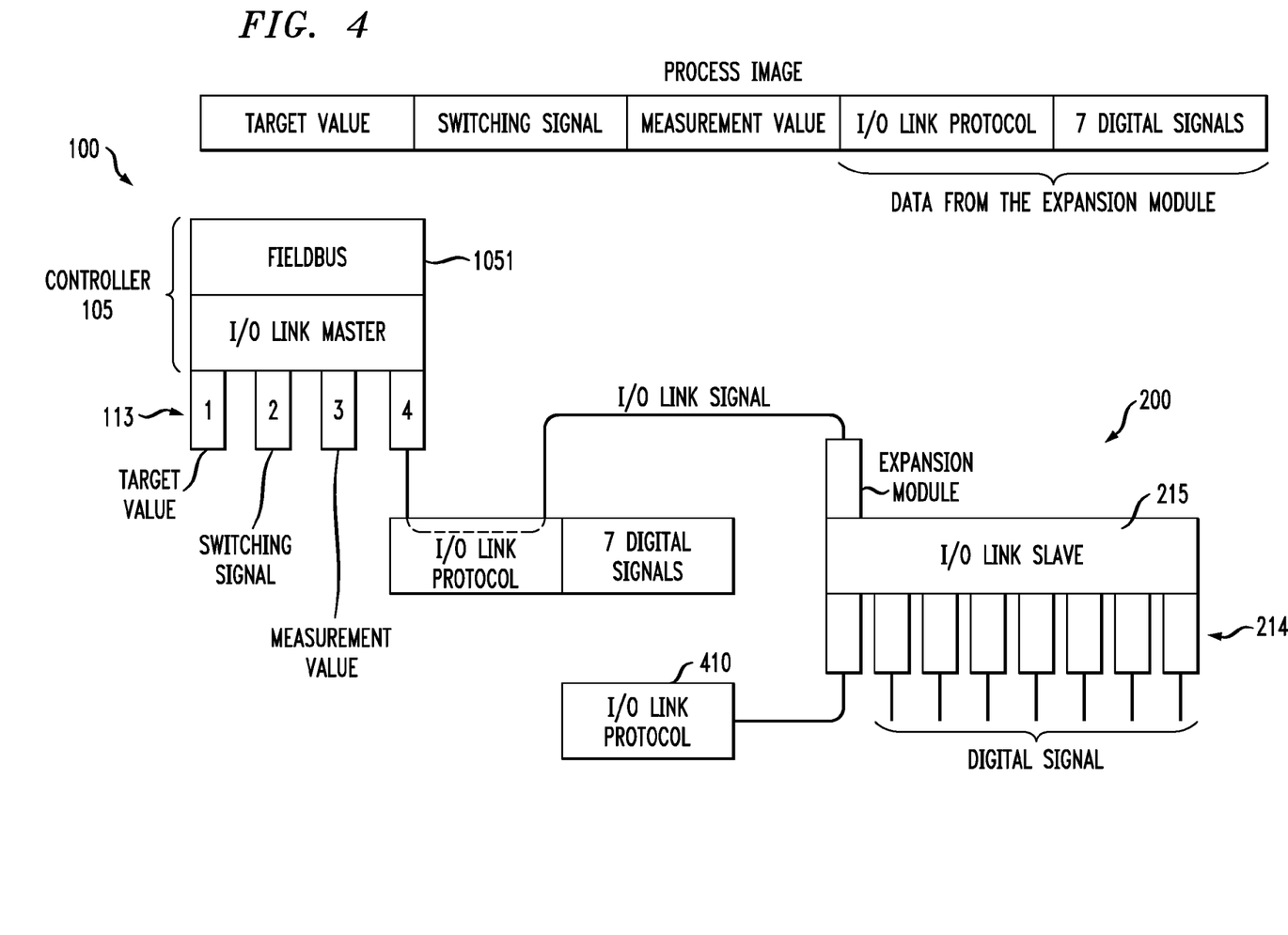

The compact I/O control master module 100 likewise has a number of third signal ports 113 and, as can be seen in more detail from an example in FIG. 4, a control logic unit for data exchange with a data bus and for targeted driving of these signal ports 113. According to a defined control logic, control logic unit 105 links signals originating basically via input modules, and outputs signals corresponding to the defined control logic via the output modules. According to the figures, control master module 100 has four third signal ports 113, labeled 113-1, 113-2, 113-3 and 113-4 in the figures.

All first, second and third signal ports 113 are signal ports adapted to signal transmission by means of point-to-point communication, and according to the above simplification in the figures, they are I/O Link ports based on point-to-point data transmission by means of three-wire terminal connections.

By integrating master module 100 with only a few point-to-point communication ports to which basically standard sensors and actuators as well as additional point-to-point communication-capable bus terminal subscribers can be connected, additional expansion slave modules according to the invention can be connected, which then, in order to expand the number of controllable or usable terminals of control master module 100, provide an additional number of ports 214 in the form of standard inputs and outputs, or also additional point-to-point communication ports.

Because, as shown in FIGS. 2 and 3, the same port among the number of third signal ports of a preceding module 100, 200 is connected according to the invention to the first signal port of a subsequent module 200, and each additional signal port of the number of third signal ports of the preceding module 100, 200 is connected to a respective signal port of the number of second signal ports of subsequent module 200, addressing of the individual expansion slave modules is no longer necessary.

If first, second and third signal ports 211, 212, 213, 113 are hard-wired point-to-point communication ports, they are preferably arranged on housing sides of the module, wherein the number of third signal ports are arranged in common on a first housing side of a respective module and, if present, the first and second signal ports are arranged in common on a second housing side, opposite the first housing side, of the respective module. In this manner, the port connections can be aligned in a simple matter with the respective other housing side, as can be seen in FIG. 2.

Figure 5A:
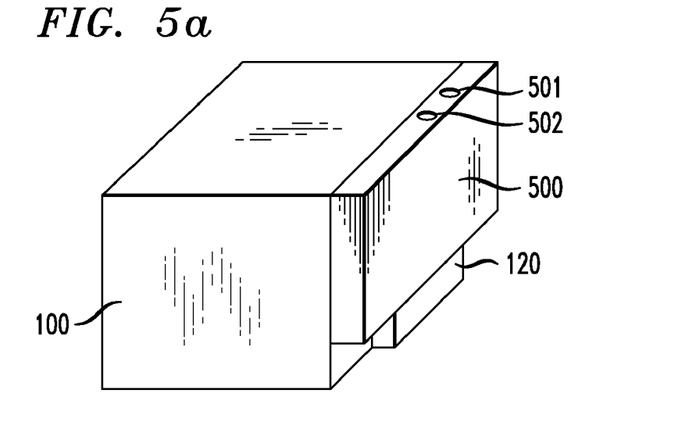
Figure 5B:
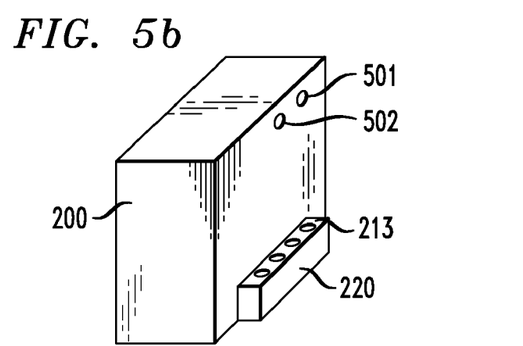

If first, second and third signal ports 211, 212, 213, 113 are connected to or integrated with a plug-in or clamp component 220 or 120, as illustrated schematically in FIGS. 5a and 5b, each module or its processing logic unit is automatically connected modularly to the respective next point-to-point communication port of the master module by simply plugging the individual modules together. Consequently, a complementarily constructed plug-in or clamp component is arranged on the housing side of an expansion slave module 200 facing a plug-in or clamp component 220.

In such a case in particular, an expansion slave module 200 preferably comprises a first series of point-to-point communication ports, which, based on the figures, comprises a first signal port 211 and the number of second signal ports 212, and comprises a second series of point-to-point communication ports, which, based on the figures, comprises the number of third signal ports 213. For example, the first port 211 in the first series of ports is connected via a point-to-point communication link to processing logic unit 215 of the corresponding slave module 200, and each of the subsequent ports 212 of the first series of ports is connected in order via a point-to-point communication link to the ports 213 of the second series of ports of the corresponding slave module, beginning with the first port in the second series of point-to-point communication ports.

FIG. 3 shows for the sake of example a point-to-point communication-capable bus terminal subscriber 410, which is connected to the fourth port 113-4 of third signal port 113 of control master module 100. In place of the point-to-point communication-capable bus terminal subscriber 410, the slave module 200 shown at the right in FIG. 3 can alternatively be integrated into the control block as the fourth expansion module, which is then automatically connected to the fourth port 113-4 of third signal port 113 of master module 100. According to FIG. 3, the latter module provides standard digital and analog input/output channels, via which corresponding bus terminal subscribers 310 can be connected.

Figure 5C:
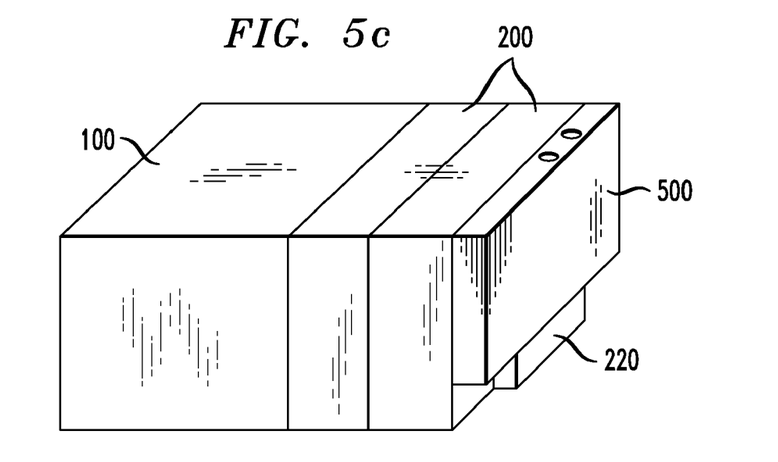

Each master and slave module 100 and 200, respectively, expediently also comprises mutually aligned voltage distribution units 501 and 502, so that the voltage is supplied overall via a common voltage supply unit 500. Such a voltage supply unit 500, as seen in FIGS. 5a-5c, for example, can form a type of terminal device, which likewise possesses correspondingly aligned voltage distribution units 501 and 502. In such a case, the expansion slave modules can be arranged, for instance, between the control master module and voltage supply unit 500, via which the voltage is supplied.

FIG. 4 shows an additional schematic sketch illustrating a process diagram of an embodiment in which the expansion slave module has at least one additional point-to-point communication port.

Control master module 100 has a control logic unit 105 that comprises a device for processing signals for point-to-point communication and for bus communication, and which is labeled "I/O Link Master" in FIG. 4. Control logic unit 105 further comprises a device, labeled 1051 in FIG. 4, for data exchange with a fieldbus connected to control master module 100.

In the illustrated example, control master module 100 in turn possesses four point-to-point communication ports 113-1, 113-2, 113-3 and 113-4. Via port 113-1, for example, a target value is output to a bus terminal subscriber, a measured value from a bus terminal subscriber is read in via port 113-3, and a switching signal from a bus terminal subscriber is detected via port 113-3. An expansion module 200 is likewise connected as a slave module at port 113-4 via a point-to-point communications link. Slave module 200 provides seven digital inputs and outputs as signal ports 214, as well as a point-to-point communication port to which a point-to-point communication-capable bus terminal subscriber 410 is connected.

Slave module 200 further comprises a processing logic unit 215, labeled "I/O Link Slave" in FIG. 4, for processing signals for point-to-point communication as well as for processing digital standard input channel signals.

As schematically illustrated, both the point-to-point protocol coming from bus terminal subscriber 410 and the seven digital standard input channel signals are processed by processing logic unit 215 and are tunneled to the master module inside a point-to-point communication signal. The process image exchanged between master module 100 and the fieldbus is thus represented in the present example by a telegram structure that comprises data relating to the "target value" in a first telegram area, data relating to the "switching signal" in a second telegram area, data relating to the "measured value" in a third telegram area and data relating to the expansion module in a fourth telegram area. The fourth telegram area is subdivided in the illustrated example into two sub-areas which comprise, respectively, the data relating to the point-to-point protocol and the seven digital standard input channel signals.

On the basis of the above description, it is obvious to the person skilled in the art that safety-oriented protocols, which are accordingly also suitable for use of safety sensors and actuators, can also be used for the point-to-point communication,

The invention claimed is:

1. An input/output channel control block that comprises a plurality of successive input/output modules, wherein the first module is an input/output control master module (100) and the subsequent modules constitute a plurality of input/output expansion slave modules (200), wherein each expansion slave module comprises a processing logic unit (215) as well as a respective first signal port (211) and a respective equal number of second signal ports (212) and an equal number of third signal ports (213), wherein the first signal port is connected to the processing logic unit, and at least one fourth signal port (214), for connecting an actuator and/or a sensor, is also connected to the processing logic unit, and a respective second signal port is connected to a third signal port, and wherein the control master module likewise possesses a plurality of third signal ports (113) and a control logic unit (105) for data exchange with the data bus and for targeted driving of these third signal ports (113) and is connected to the plurality of expansion slave modules in such a manner that the same port among the plurality of third signal ports of a prior module is connected to the first signal port of a subsequent module, and each additional signal port of the plurality of third signal ports is connected to a respective signal port of the plurality of second signal ports of the subsequent module.

2. An input/output control master module for driving input/output expansion slave modules for a compact input/output channel control block in which each expansion slave module (200) comprises a processing logic unit (215) as well as a respective first signal port (211) and a respective equal number of second signal ports (212) and an equal number of third signal ports (213), wherein the first signal port is connected to the processing logic unit, and at least one fourth signal port (214), for connecting an actuator and/or a sensor, is also connected to the processing logic unit, and a respective second signal port is connected to a third signal port, wherein     control master module (100) likewise possesses a plurality of third signal ports (113) and a control logic unit (105) for data exchange with a data bus and for targeted driving of these third signal ports (113) and the connection to the plurality of expansion slave modules     is to be provided such that     a signal port from the plurality of third signal ports (113) of the control master module is connected to the first signal port (211) of a subsequent module, and each additional signal port of the plurality of third signal ports is connected to a respective signal port of the plurality of second signal ports of the subsequent module.

3. An expansion slave module for an input/output channel control block that comprises a plurality of successive input/output modules, wherein the first module is an input/output control master module (100) and the subsequent modules constitute a plurality of input/output expansion slave modules (200), wherein     each expansion slave module of said input/output channel control block comprises a processing logic unit (215) as well as a respective first signal port (211) and a respective equal number of second signal ports (212) and an equal number of third signal ports (213), wherein the first signal port is connected to the processing logic unit, and at least one fourth signal port (214) for connecting an actuator and/or a sensor is also connected to the processing logic unit, and a respective second signal port is connected to a third signal port, and wherein     the control master module of said input/output channel control block likewise possesses a plurality of third signal ports (113) and a control logic unit (105) for data exchange with the data bus and for targeted driving of these third signal ports (113) and is connected to the plurality of expansion slave modules     in such a manner that the same port among the plurality of third signal ports of a prior module is connected to the first signal port of a subsequent module, and each additional signal port of the plurality of third signal ports is connected to a respective signal port of the plurality of second signal ports of the subsequent module,     characterized in that said expansion slave module comprises a processing logic unit (215) as well as a respective first signal port (211) and a respective equal number of second signal ports (212) and an equal number of third signal ports (213), wherein the first signal port is connected to the processing logic unit, and at least one fourth signal port (214), for connecting an actuator and/or a sensor, is also connected to the processing logic unit, and a respective second signal port is connected to a third signal port.

4. The input/output channel control block according to claim 1, wherein the first, second and third signal ports are adapted for signal transmission by means of point-to-point communication.

5. The input/output channel control block according to claim 1, wherein the signal ports are constructed for cabled or cable-free signal transmission.

6. The input/output channel control block according to claim 5, wherein the control logic unit possesses a unit for processing signals for point-to-point communications and for a bus communication.

7. The input/output channel control block according to claim 1, wherein the processing logic unit possesses a unit for processing signals for point-to-point communication.

8. The input/output channel control block according to claim 7, wherein the processing logic unit is constructed for processing digital or analog standard input/output channel signals.

9. The input/output channel control block according to claim 1, wherein the fourth ports provide digital or analog standard input/output channel signals.

10. The input/output channel control block according to claim 1, wherein with regard to a respective slave module the plurality of third signal ports is arranged in common on a first housing side and the first and second signal ports are arranged in common on a second housing side opposite the first.

11. The input/output channel control block according to claim 1, wherein the first, second and third signal ports are connected to or integrated into a plug-in or clamp component.

12. The input/output channel control block according to claim 1 wherein each of the plurality of input/output expansion slave modules is connected to a first series of point-to-point communication ports (211, 212) and a second series of point-to-point communication ports (213), wherein the first port in the first series of ports is connected via a point-to-point communication link to a processing unit (215) coupled to at least one fourth signal port (214), and wherein the subsequent ports of the first series of ports are each connected in order via a point-to-point communication link to the ports of the second series of ports beginning with the first port in the second series.

13. The input/output channel control block according to claim 1, wherein the point-to-point communication is based on a safety-oriented protocol that is suitable for the use of safety sensors and actuators.

14. The input/output channel control block according to claim 1, wherein the expansion slave modules are arranged between the control master module and a voltage supply unit (500), and each module has voltage distribution units (501, 502) aligned with one another, so that all modules are operated by means of the voltage supplied via the voltage supply unit.

15. The input/output channel control block according to claim 1, wherein the plurality of third signal ports of the control master module is arranged in common on a first housing side.

16. The input/output control master module according to claim 2, wherein the first, second and third signal ports are adapted for signal transmission by means of point-to-point communication.

17. The input/output control master module according to claim 2, wherein the signal ports are constructed for cabled or cable-free signal transmission.

18. The input/output control master module according to claim 17, wherein the control logic unit possesses a unit for processing signals for point-to-point communications and for a bus communication.

19. The input/output control master module according to claim 2, wherein the processing logic unit possesses a unit for processing signals for point-to-point communication.

20. The input/output control master module according to claim 19, wherein the processing logic unit is constructed for processing digital or analog standard input/output channel signals.

21. The input/output control master module according to claim 2, wherein the fourth ports provide digital or analog standard input/output channel signals.

22. The input/output control master module according to claim 2, wherein with regard to a respective slave module the plurality of third signal ports is arranged in common on a first housing side and the first and second signal ports are arranged in common on a second housing side opposite the first.

23. The input/output control master module according to claim 2, wherein the plurality of third signal ports of the control master module is arranged in common on a first housing side.

24. The input/output control master module according to claim 2, wherein the first, second and third signal ports are connected to or integrated into a plug-in or clamp component.

25. The input/output control master module according to claim 2, wherein each of the plurality of input/output expansion slave module is connected to a first series of point-to-point communication ports and a second series of point-to-point communication ports, wherein the first port in the first series of ports is connected via a point-to-point communication link to a processing unit coupled to at least one fourth signal port, and wherein the subsequent ports of the first series of ports are each connected in order via a point-to-point communication link to the ports of the second series of ports beginning with the first port in the second series.

26. The input/output control master module according to claim 2, wherein the point-to-point communication is based on a safety-oriented protocol that is suitable for the use of safety sensors and actuators.

27. The expansion slave module according to claim 3, wherein the first, second and third signal ports are adapted for signal transmission by means of point-to-point communication.

28. The expansion slave module according to claim 3, wherein the signal ports are constructed for cabled or cable-free signal transmission.

29. The expansion slave module according to claim 28, wherein the control logic unit possesses a unit for processing signals for point-to-point communications and for a bus communication.

30. The expansion slave module according to claim 3, wherein the processing logic unit possesses a unit for processing signals for point-to-point communication.

31. The expansion slave module according to claim 30, wherein the processing logic unit is constructed for processing digital or analog standard input/output channel signals.

32. The expansion slave module according to claim 3, wherein the fourth ports provide digital or analog standard input/output channel signals.

33. The expansion slave module according to claim 3, wherein with regard to said respective slave module the plurality of third signal ports is arranged in common on a first housing side and the first and second signal ports are arranged in common on a second housing side opposite the first.

34. The expansion slave module according to claim 3, wherein the first, second and third signal ports are connected to or integrated into a plug-in or clamp component.

35. The expansion slave module according to claim 3, wherein the point-to-point communication is based on a safety-oriented protocol that is suitable for the use of safety sensors and actuators.

* * * * *